United States Patent
Stone (10) Patent No.: US 7,429,497 B2
(45) Date of Patent: Sep. 30, 2008

(54) HYBRID PACKAGE WITH NON-INSERTABLE AND INSERTABLE CONDUCTIVE FEATURES, COMPLEMENTARY RECEPTACLE, AND METHODS OF FABRICATION THEREFOR

(75) Inventor: Brent Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 11/390,531

(22) Filed: Mar. 27, 2006

(65) Prior Publication Data
US 2006/0166401 A1 Jul. 27, 2006

Related U.S. Application Data

(62) Division of application No. 10/608,050, filed on Jun. 27, 2003, now Pat. No. 7,053,496.

(51) Int. Cl.
*H01L 21/00* (2006.01)
*H01L 23/02* (2006.01)
*G01R 31/28* (2006.01)
*G01R 31/02* (2006.01)

(52) U.S. Cl. .................. 438/106; 438/15; 438/51; 438/55; 257/678; 257/798; 324/755; 324/158.1; 439/73; 439/342

(58) Field of Classification Search ............ 438/106, 438/15, 51, 55; 324/755, 158.1; 439/73, 439/342; 257/678, 798
See application file for complete search history.

(56) References Cited

U.S. PATENT DOCUMENTS

| | | | |
|---|---|---|---|
| 5,532,612 A | 7/1996 | Liang | |
| 5,569,041 A | 10/1996 | Sonobe et al. | |
| 6,280,202 B1 | 8/2001 | Alden, III et al. | |
| 6,354,844 B1 | 3/2002 | Coico et al. | |
| 6,717,277 B2 | 4/2004 | Chung et al. | |
| 2003/0168738 A1 | 9/2003 | Kabadi et al. | |
| 2003/0193089 A1 | 10/2003 | Rumsey et al. | |
| 2004/0262725 A1 | 12/2004 | Stone | |

OTHER PUBLICATIONS

"U.S. Appl. No. 10/608,050, Final Office Action mailed Sep. 6, 2005", 9 pgs.
"U.S. Appl. No. 10/608,050, Non Final Office Action mailed Mar. 8, 2005", 8 pgs.

(Continued)

*Primary Examiner*—Long K Tran
(74) *Attorney, Agent, or Firm*—Schwegman, Lundberg & Woessner, P.A.

(57) ABSTRACT

A hybrid electronic circuit package (102, FIG. 1) includes non-insertable conductive features (110) and insertable conductive features (112) at a surface of the package. A hybrid receptacle (120), such as a socket, for example, includes non-insertable contacts (124) and insertable contacts (126), which are positioned in a complementary manner with the non-insertable and insertable features of the package. A vertical securement device (132, 134, 136) applies a vertical compressive force to the package (102) to compress the non-insertable features (110) against the non-insertable contacts (124). Further, a normal force securement device can be used to provide a sustained normal force to compress the insertable features and contacts together. In one embodiment, the non-insertable features are land grid array lands and the insertable features are low insertion force features.

16 Claims, 9 Drawing Sheets

OTHER PUBLICATIONS

"U.S. Appl. No. 10/608,050, Notice of Allowance mailed Dec. 29, 2005", 4 pgs.

"U.S. Appl. No. 10/608,050, Response filed Jan. 10, 2005 to Restriction Requirement mailed Dec. 9, 2004", 1 pg.

"U.S. Appl. No. 10/608,050, Response filed Jun. 8, 2005 to Non Final Office Action mailed Mar. 8, 2005", 12 pgs.

"U.S. Appl. No. 10/608,050, Response filed Dec. 6, 2005 to Final Office Action mailed Sep. 6, 2005", 5 pgs.

"U.S. Appl. No. 10/608,050, Restriction Requirement mailed Dec. 9, 2004", 5 pgs.

HYBRID PACKAGE WITH NON-INSERTABLE AND INSERTABLE CONDUCTIVE FEATURES, COMPLEMENTARY RECEPTACLE, AND METHODS OF FABRICATION THEREFOR

DIVISIONAL APPLICATION

The present application is a divisional of application U.S. Ser. No. 10/608,050, filed on Jun. 27, 2003, now issued as U.S. Pat. No. 7,053,496, which is incorporated herein by reference.

TECHNICAL FIELD

The subject matter relates generally to electronic circuit packages and receptacles and, more particularly, to physical and electrical interconnections between packages and receptacles, and to methods of fabrication thereof.

BACKGROUND

Input/output (I/O) signals, power, and ground typically are routed to and from an integrated circuit (IC) package through interfaces on the bottom or sides of the IC package. For socketed packages, electrical interfaces on the bottom of the package typically mate with complementary connectors at the top surface of a socket or printed circuit board.

For example, a land grid array (LGA) package includes "land" electrical interfaces, which are substantially flat and co-planar with the bottom surface of the package. To connect the package to a socket, the package's lands are aligned with corresponding electrical mating interfaces of conductive socket contacts. Then, a sustained vertical, compressive force is applied to hold the assembly together and to ensure electrical functionality of all of the contacts. For example, a clamping mechanism might be installed to compress the package toward the socket.

For power delivery, as opposed to I/O, relatively high compressive forces are desirable to achieve lower interface resistance between the package land and the socket contacts. For a high land count LGA package and socket, this results in a compressive load requirement that has a significant impact on system design. For example, an 800 land LGA package with a typical force of 30 grams per land would require a minimum of 24 kilograms (i.e., about 53 pounds) of sustained, vertical compressive force to be applied between the LGA package and socket.

Alternatively, a pin grid array (PGA) package includes conductive pins, which extend vertically from the bottom surface of the package. The package is placed into a socket by inserting all of the pins into corresponding pin holes in the top surface of the socket. Using conventional PGA socket technologies, a horizontal "actuation force" is applied between the package and the socket to electrically engage the package pins with corresponding socket contacts. The electrical engagement of a PGA pin to its complementary socket contact requires that a sustained "normal force" be present, and this typically is a horizontal force for PGA socket technologies. This sustained normal force usually is sufficient to hold the package in place after actuation. Accordingly, no sustained vertical force typically is necessary. One disadvantage to PGA packages is that excessive force potentially may be applied on pins during handling or socket actuation, which can damage pins and result in lower yields.

Using a low insertion force (LIF) package and socket connection, conductive features on the package, which extend vertically from the bottom surface of the package, mate with complementary contacts within a socket. A vertical insertion force is used to engage a LIF package into the socket. Then the electrical engagement of a LIF package feature and socket contact requires a sustained normal force to be present, and this sustained normal force is generated when the vertical insertion force is applied. The sustained normal force generally is sufficient to hold the package in place after insertion, and a sustained, vertical compressive load between the package and socket typically is not applied.

For PGA and LIF technologies, the respective actuation and insertion force required for electrical engagement can be quite large. For example, an 800 contact LIF package could require a typical value of 60 grams of vertical insertion force per contact, thus requiring a minimum of 48 kilograms (i.e., approximately 106 pounds) of vertical insertion force between the LIF package and socket.

What are needed are packaging interconnection technologies, which require lower insertion and/or actuation forces while ensuring sufficient contact normal forces throughout a device's operational range. Further needed are packaging interconnection technologies, which benefit from the advantages provided by compression-type contacts (e.g., LGA) and insertable-type contacts (e.g., PGA and LIF), without the high actuation or insertion force disadvantages inherent in using these connection types.

BRIEF DESCRIPTION OF THE DRAWINGS

Embodiments of the inventive subject matter are particularly pointed out and distinctly claimed in the concluding portion of the specification. However, embodiments of the inventive subject matter, both as to organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of embodiments of the invention. However, it will be understood by those skilled in the art, that the embodiments of the invention may be practiced without these specific details. In other instances, well-known methods, procedures, components, and circuits have not been described in detail so as not to obscure the embodiments of the invention.

Figure 1:
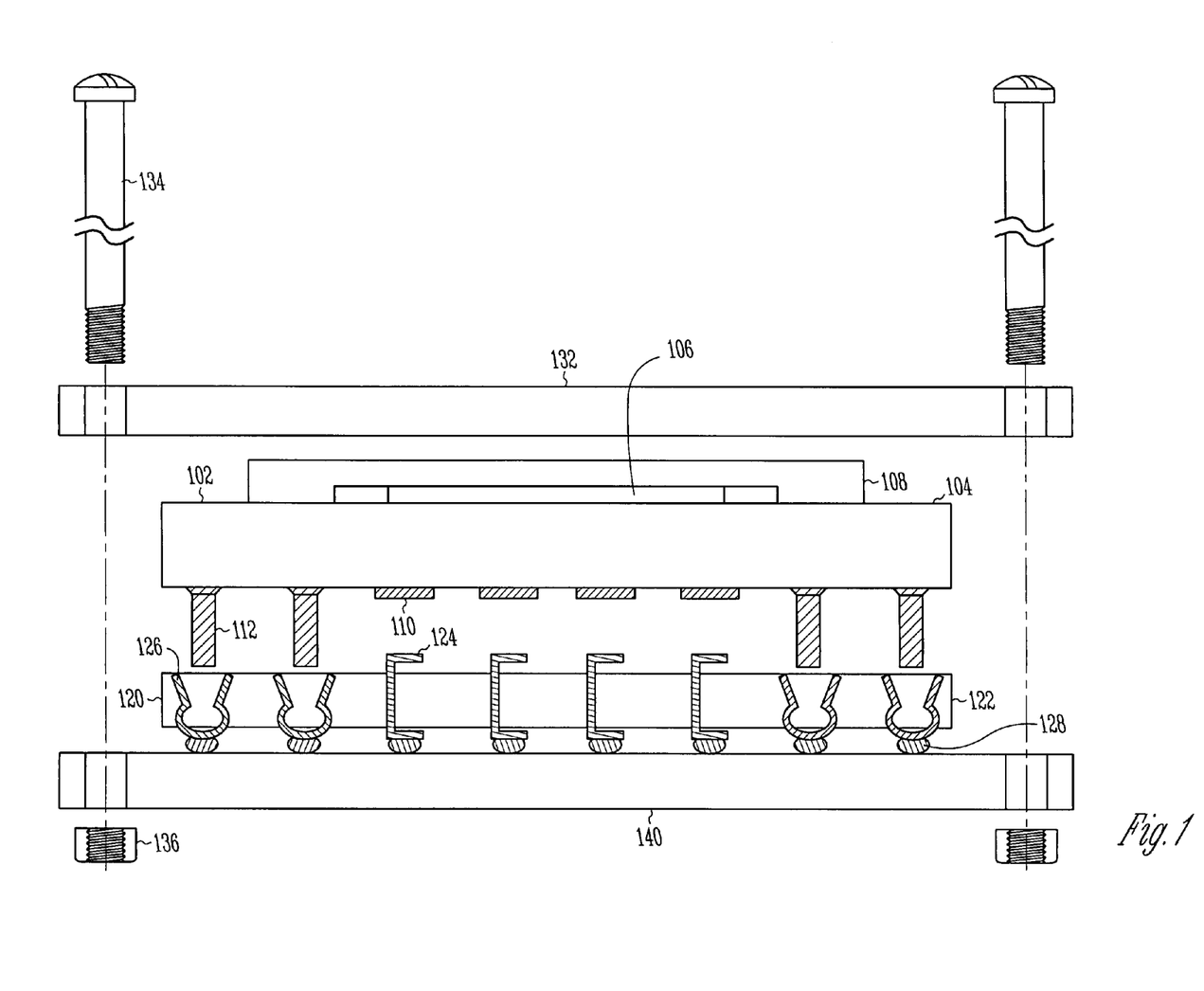
FIG. 1 illustrates a partially exploded, cross-sectional view of an electronic assembly, prior to interconnection, which includes an electronic circuit package with both non-insertable and insertable conductive features, and a corresponding receptacle, in accordance with an embodiment of the invention.

FIG. 1 illustrates a partially exploded, cross-sectional view of an electronic assembly, prior to interconnection, which includes an electronic circuit package 102 with both non-insertable conductive features 110 and insertable conductive features 112, and a corresponding receptacle 120, in accordance with an embodiment of the invention. In addition, a circuit board 140 is shown. The package 102 is referred to herein as a "hybrid package," as it includes both non-insertable features 110 and insertable features 112, in contrast to prior package types.

The hybrid package 102 includes a substrate 104 and an integrated circuit 106, in one embodiment. Integrated circuit 106 is electrically and mechanically secured to the top surface of substrate 104, and may be encapsulated by a cap 108. In other embodiments, the package 102 could include multiple integrated circuits and/or discrete devices (not shown).

Conductive structures (not shown) within the substrate 104 provide conductive paths between the integrated circuit 106 and features 110, 112 on the bottom surface of the substrate 104. In an embodiment, the features include at least one non-insertable feature 110 and at least one insertable feature 112.

Each insertable feature 112, extends in a perpendicular direction from the horizontal bottom surface of package 102. In various embodiments, insertable feature 112 could be a low insertion force (LIF) feature, pin, bar, tab or other conductive structure that protrudes from the bottom surface a distance that is sufficient to facilitate insertion of the feature into a corresponding insertable contact within receptacle 120. Further, each insertable feature 112 is a conductive structure that is capable of being held in physical proximity to receptacle 120 by forces provided by receptacle 120 (e.g., normal forces from contact surfaces within an insertable contact).

Each non-insertable feature 110 does not significantly protrude in the vertical direction from the bottom surface of package 102, in one embodiment. Instead, in various embodiments, each non-insertable feature 110 is exposed at the bottom of package 102, and is either substantially flat (i.e., substantially co-planar with the bottom surface), or includes a bump or other structure that does not substantially protrude from the bottom in the vertical direction. In one embodiment, the major, exposed surface of non-insertable feature 110 is substantially flush with, or slightly above or below the plane defined by the bottom surface of package 102.

In one embodiment, a non-insertable feature 110 is designed so that, when the insertable features 112 are inserted into and engaged with insertable contacts 126 of a next level of interconnect (i.e., the insertable features 112 extend below the top surface and into the body of the next level of interconnect), the non-insertable features 110 will not insert substantially into the next level of interconnect (i.e., the non-insertable features 110 will not extend substantially below the top surface of the next level of interconnect).

In one embodiment, a non-insertable feature 110 is a conductive structure that is not held in physical proximity to receptacle 120 by sustained normal forces provided by receptacle 120 (e.g., normal forces from contact surfaces within a contact of receptacle 120), whether or not the non-insertable feature 110 extends substantially below the top surface of the next level of interconnect. Instead, the non-insertable features 110 are compressed against non-insertable contacts 124 on the next level of interconnect, such as by a vertical force, for example. Accordingly, in one embodiment, a non-insertable feature 110 is referred to as a "compression feature."

Receptacle 120 could be a socket or other level of interconnection between the package 102 and circuit board 140, in one embodiment. Alternatively, the receptacle could be integral with the circuit board 140. For ease of description, receptacle 120 is described as a socket. The terms "receptacle" and "hybrid receptacle" are meant to include sockets, receptacle portions of printed circuit boards or any other lower level of interconnect. Additionally, where the specific term "socket" is used, it is meant to apply to these alternate embodiments as well.

Hybrid receptacle 120 includes a body 122 that supports contacts 124, 126. Body 122, for example, could be formed from plastic (e.g., liquid crystal polymer), PCB materials (e.g., FR4) or other materials. Contacts 124, 126 are arranged in a manner that corresponds to the arrangement of features 110, 112 on the package 102. In one embodiment, the contacts include at least one non-insertable contact 124, which is correspondingly located with respect to a non-insertable feature 110, and at least one insertable contact 126, which is mateable with and correspondingly located with respect to an insertable feature 112.

In one embodiment, where insertable feature 112 is a LIF feature, insertable contact 126 is a LIF contact. In another embodiment, where feature 112 is a pin, contact 126 includes a pin hole and corresponding conductive structure within the pin hole. In still other embodiments, where feature 112 takes another form, contact 126 is configured to accept and make electrical connection with feature 112.

In various embodiments, non-insertable contact 124 is a compression contact or a spring-force contact (e.g., a metal structure, as shown, or a single or double compression elastomeric contact), meaning that the portion of the contact 124 that is exposed at the top surface of the socket 120 is configured to compress against the corresponding non-insertable feature 110 when the assembly of the package 102 and the socket 120 is complete. Alternatively, contact 124 could include lands and/or conductive bumps in lieu of a compression or spring-force portion. In those embodiments, insertable feature 110 could be a compression or spring-force contact similar to contact 124. Other compressive contact structures also could be used in other embodiments.

Each contact 124, 126 by itself, or in conjunction with other conductive structures (not shown) within the body 122, provides a conductive path between a feature 110, 112 and socket electrical interfaces 128 on the bottom of the socket 120. The socket interfaces 128 enable electrical and mechanical connection to a circuit board 140 or other level of interconnection.

In the embodiment illustrated in FIG. 1, the bottoms of contacts 124, 126 are attached to printed circuit board 140 using solder connections 128 (e.g., BGA). In alternate embodiments, contacts 124, 126 could be attachable to printed circuit board 140 using pinned, LIF, compression or other types of connections. Accordingly, for example, instead of using a single compression contact for non-insertable contact 124, a double compression contact (e.g., a cylindrical elastomeric, double LGA, or other conductive contact) could be used, which supports a compression connection at both the top and bottom portions of the contact (i.e., at the top and bottom surfaces of the socket 120).

A vertical securement device is employed to connect package 102, socket 120, and circuit board 140. In one embodiment, the vertical securement device includes at least one top member, spanning member, and retention device. For example, the top member could be a rigid plate 132 or other one-part or multiple-part structure designed to contact all or portions of the top surface of the package 102. In one embodiment, top member is formed from a metal, such as aluminum, which has good heat conductive properties. Other metals, plastics or materials alternatively could be used.

Spanning members could be bolts 134, screws, posts, clamps, pins, clips, or other structures that can extend between and secure the top member and the circuit board 140. Finally, retention devices, such as nuts 136, pins, clips, or brazed and/or solder connections, can be used to maintain the attachment of the spanning members to the circuit board 140. Other types of vertical securement devices alternatively could be used, such as securement devices that include adhesives and/or other mechanical engagement devices.

In one embodiment, the vertical securement device is the primary mechanism for applying a sustained vertical force to hold together the assembly. In another embodiment, the assembly also includes at least one device for applying a sustained normal force to insertable features. This device is referred to herein as a "normal force securement device."

In one embodiment, the normal force securement device is a horizontal securement device (not shown), although the device for applying the sustained normal force could apply a force that is not substantially horizontal (e.g., the force could be diagonal or substantially vertical). For ease of description, the example of a horizontal securement device is discussed herein. For example, a horizontal securement device could be used in conjunction with an embodiment where insertable features 112 are low insertion force (LIF) features, and insertable contacts 126 are configured to accept the LIF features. Accordingly, the horizontal securement device could be a mechanical structure that is integral with or separate from socket 120.

In one embodiment, prior to LIF feature insertion, the horizontal securement device is in a configuration where the internal width of each socket contact is large enough to allow insertion of the LIF feature with little or no vertical insertion force. The horizontal securement device can then be engaged so that the internal width is reduced, thus compressing the conductive surfaces within the contact openings against the LIF features.

In another embodiment, the horizontal securement device could be adjusted to push the package 102 in a horizontal direction, thus compressing the insertable features 112 against the conductive surfaces within the insertable contacts 126. Basically, the horizontal securement device applies a sustained, horizontal force (i.e., a normal force) between the insertable features 112 and the insertable contacts 126.

In an embodiment that uses pinned or other insertable features, a separate horizontal securement device may not be included. Instead, a normal force (e.g., a horizontal force) could be applied automatically by contact forces from surfaces within the insertable contacts 126. Accordingly, a mechanism to provide a sustained, horizontal force to the insertable contacts could include, for example, contact surfaces within the receptacle contacts 126 that apply horizontal forces to insertable features through spring action or through another suitable mechanism (i.e., a horizontal securement device) that is internal or external to the receptacle.

In still another embodiment, a single securement device could be used to apply both horizontal and vertical sustained forces. For example, the single securement device could apply a diagonal force to the package 102, with both horizontal and vertical force components.

The hybrid package and receptacle described above may substantially lower the compressive loading requirements of non-insertable technologies (e.g., LGA, spring force, and other non-insertable types of contacts), while still achieving an acceptable interface resistance. This is accomplished by taking advantage of the insertion-force properties inherent in insertable technologies (e.g., LIF, pinned, and other insertable types of contacts).

For example, in one embodiment, non-insertable features could be designated to carry primarily or exclusively signals (i.e., I/O) during operation, meaning that the non-insertable features are electrically coupled to circuits that use or produce I/O signals. In addition, the insertable features could be designated to carry primarily or exclusively power and ground, during operation, meaning that the insertable features are electrically coupled to circuits that consume power or require ground connections. Thus, during operation, I/O signals are interchanged between first electronic circuits, which use or produce the I/O signals, and one or more non-insertable features at a first surface of an electronic circuit package. Additionally, power is interchanged between second electronic circuits, which consume the power, and one or more insertable features at the first surface. In this embodiment, a lower sustained, vertical, compressive force per feature could be used, since a higher resistance interconnect is often acceptable for I/O, as opposed to the lower resistance interconnects desirable for power/ground connections.

In one embodiment, a hybrid package and receptacle includes 800 or more features and corresponding contacts, although more or fewer features and contacts could be used in other embodiments. For example, the hybrid package could include a first number (e.g., 600) of non-insertable features for carrying I/O and a second number (e.g., 200) of insertable features for carrying power and ground. Acceptable electrical performance may be achieved with sustained vertical forces that are significantly lower than those required by prior art technologies. For example, good performance may be achieved, in the above example, using 20 grams of vertical compressive force per feature, equating to about 12 kilograms (i.e., about 26 pounds) of vertical compressive force. This represents a reduction of 50% from the 24 kilograms typically used in the prior art example in the Background section.

Similarly, the horizontal forces applied to the insertable features also may be reduced. For example, good performance may be achieved, in the above example, using 60 grams horizontal force per feature, equating to about 12 kilograms (i.e., about 26 pounds) of horizontal force. This represents a reduction of 75% from the 48 kilograms typically used in the prior art example in the Background section.

Another advantage to using a hybrid package and a hybrid receptacle, in accordance with the various embodiments, is that pitch scaling between non-insertable features can be reduced without substantially decreasing performance. For example, LGA technology can allow pitch scaling to below about 1 millimeter between features. However, lower pitch scaling can result in higher trace resistance in motherboards, thus limiting the scalability of LGA technologies using prior art techniques. By utilizing the insertable features and contacts for power delivery, in accordance with the embodiments of the invention, the power and I/O features can be separated, allowing the I/O pitch to be scaled independently from the insertable feature interface. Accordingly, the pitch between non-insertable features can be reduced without substantial performance degradation, using embodiments of the present inventive subject matter.

Figure 2:
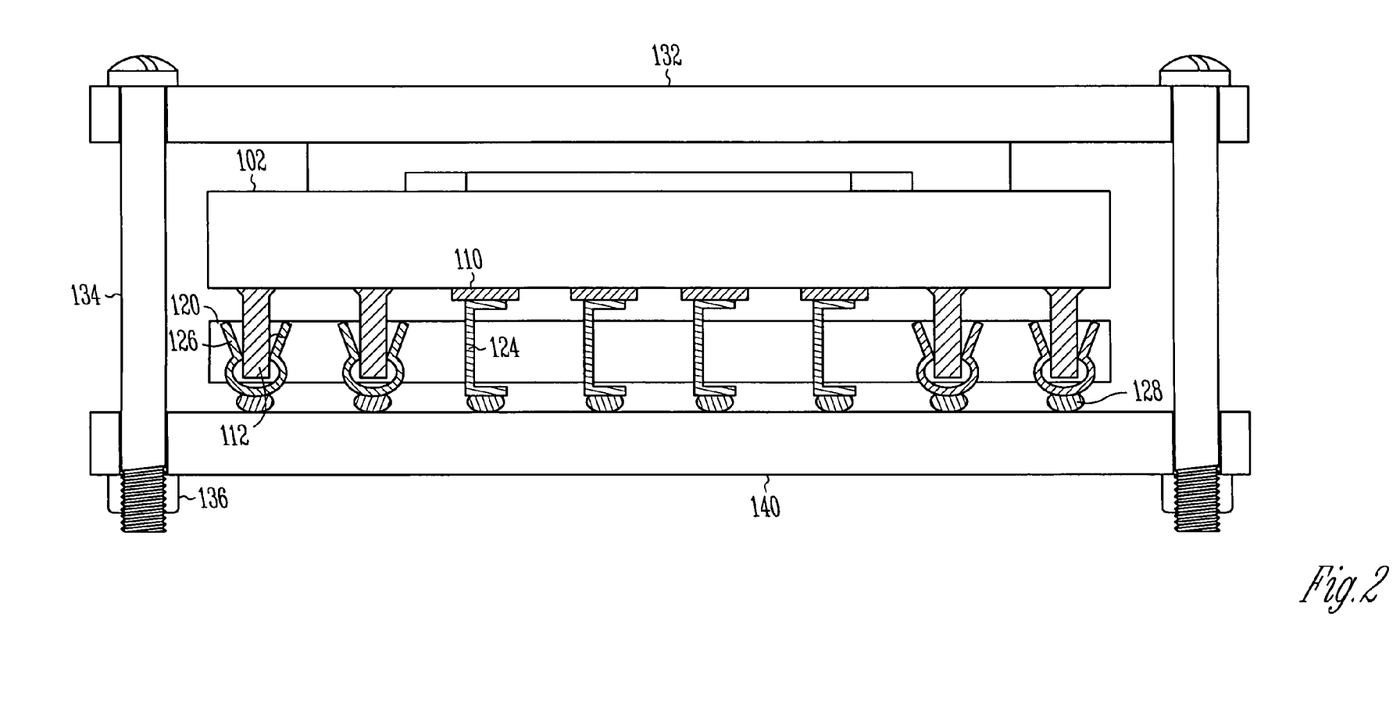
FIG. 2 illustrates a cross-sectional view of the electronic assembly of FIG. 1 after interconnection.

FIG. 2 illustrates a cross-sectional view of the electronic assembly of FIG. 1 after interconnection. To produce the assembly of FIG. 2, the socket 120 may be first connected to the circuit board 140 (or other level of interconnect) using a connection technique that is appropriate for the type of features and contacts that are used to electrically connect the socket 120 and circuit board 140. For example, where BGA technology is used, features on the bottom surface of the socket 120 are aligned with contacts on the top surface of the circuit board. Then a permanent connection is made using conductive spheres 128 (e.g., solder spheres) interposed between the socket 120 and circuit board 140. The conductive spheres 128 are heated and cooled in order to flow onto and connect the features and contacts. The socket 120 is then rigidly attached to the circuit board 140.

In an alternate embodiment, other non-insertable, socket-to-board features and contacts could be used. For example, socket-to-board features and contacts could include lands, bumps, and/or compression contacts (e.g., elastomeric contacts). In these embodiments, the socket 120 and circuit board 140 may not be permanently attached, but may be held together by applying a sustained force to compress the package 102, socket 120, and circuit board 140 together.

In still another alternate embodiment, insertable socket-to-board features (e.g., pins, LIF features, bars, etc.) may project in a vertical direction from the bottom of socket 120. These features may insert into complementary contacts on the top surface of the circuit board 140.

In still another alternate embodiment, the socket 120 may include both insertable and non-insertable socket-to-board features, and the board 140 may include corresponding insertable and non-insertable contacts, as is described in conjunction with the embodiments herein. Similarly, the board 140 may include both insertable and non-insertable socket-to-board features, and the socket 120 may include corresponding insertable and non-insertable contacts. For purposes of brevity, these embodiments are not illustrated.

After alignment and attachment of the socket 120 and circuit board 140, the package 102 is connected to the socket 120 or, alternatively, to a non-socket receptacle (e.g., another level of interconnect or a receptacle integral with the board 140). This is done by aligning the package features 110, 112 on the bottom of the package 102 with the socket's contacts 124, 126. Then, the insertable features 112 are inserted into the insertable contacts 126. If the insertable features 112 are LIF features, then a horizontal securement device is engaged to hold the insertable features 112 rigidly in place with the insertable contacts 126. As described previously, the horizontal securement device could be internal or external to the receptacle.

If the insertable features 112 are not LIF features (e.g., features 112 are pins, bars, or other non-LIF type features), then the spring force applied by the insertable contact 126 may be sufficient to hold the insertable features 112 at least partially in place, and a horizontal securement device may not be used.

Next, the vertical securement device is engaged. In one embodiment, the securement device's top member (e.g., rigid plate 132) is brought into contact with all or a portion of the top surface of the package, and the securement device's spanning members (e.g., bolts 134) are used to span the distance between and compress the top member toward the circuit board 140. In an embodiment that uses bolts 134 and nuts 136, the bolts 134 are passed through holes in the top member 132 and inserted through corresponding holes in the circuit board 140. Nuts 136, which can serve as retention mechanisms, are applied to the bottom of bolts 134, and the bolts 134 are tightened until a sufficient, sustained vertical force is present. In alternate embodiments (e.g., where screws or other attachment mechanisms are used), the method of securing the top member may be in accordance with the type of spanning member or members.

Once assembled, the top member 132 compresses against the top surface of the package 102, which causes the non-insertable package features 110 to compress against the non-insertable receptacle contacts 124. This provides a sustained, vertical, compressive force between the features 110 and contacts 124.

An advantage to the embodiments of the invention is apparent from the above description. Specifically, the use of insertable features and contacts facilitates alignment of the non-insertable features and contacts. By engaging the insertable features and contacts first, the corresponding non-insertable features and contacts are automatically aligned.

Figure 3:
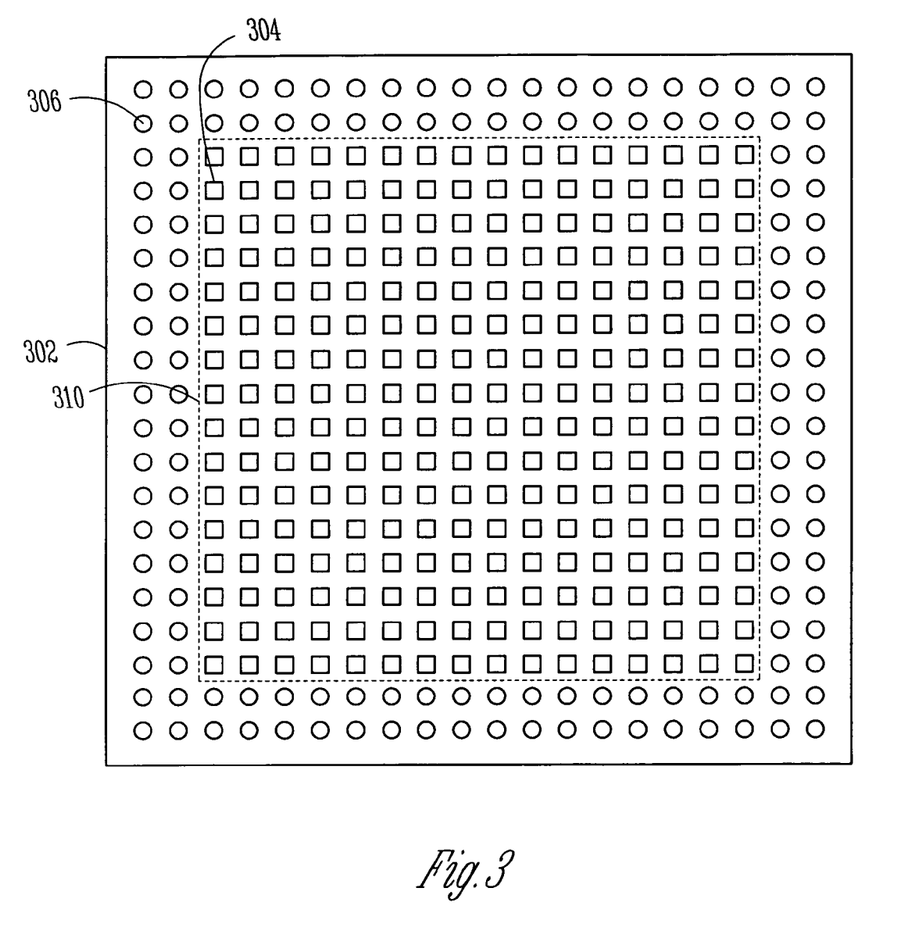
FIG. 3 illustrates a bottom view of an electronic circuit package, in accordance with an embodiment of the invention.
Figure 4:
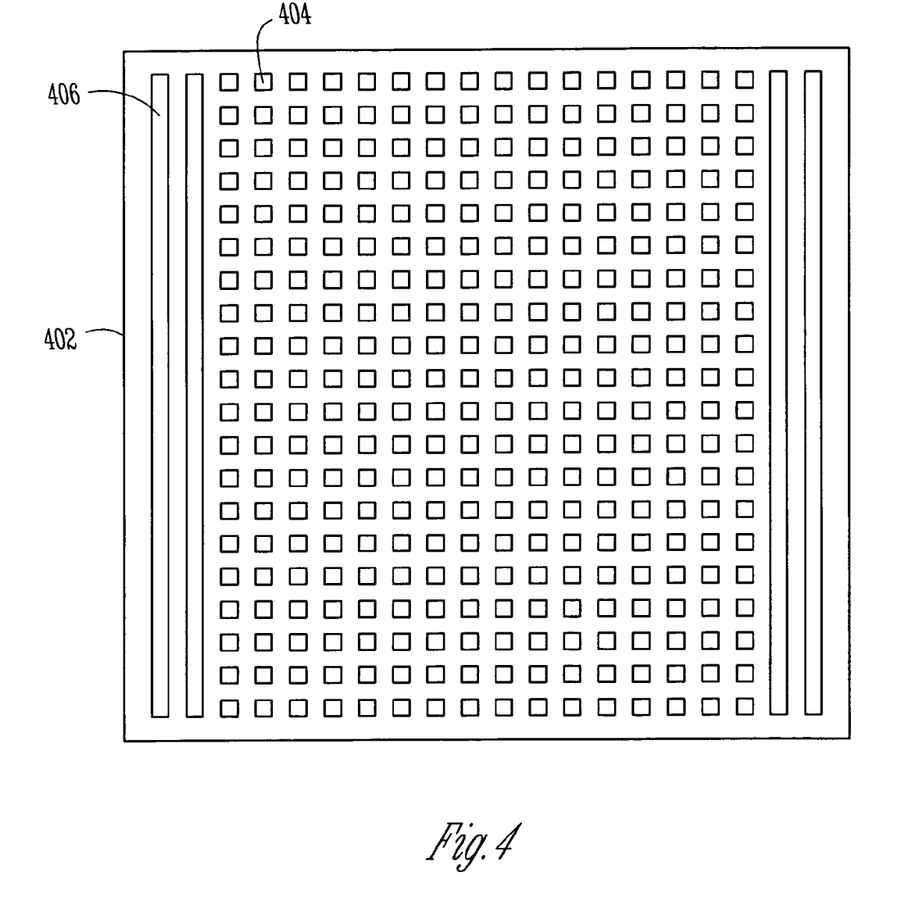
FIG. 4 illustrates a bottom view of an electronic circuit package, in accordance with another embodiment of the invention.

As described previously, the bottom of package 102 includes at least one non-insertable feature 110 and at least one insertable feature 112. In some configurations, numerous non-insertable and insertable features 110, 112 could be employed. In other configurations, just one or a few of either type of feature 110, 112 could be used. FIGS. 3 and 4 are used to illustrate just two possible embodiments, and they are not meant to limit the scope of the present inventive subject matter.

FIG. 3 illustrates a bottom view of an electronic circuit package, in accordance with an embodiment of the invention. As described previously, the bottom surface of package 302 includes at least one non-insertable feature 304 and at least one insertable feature 306. For illustration purposes, non-insertable features 304 are shown as having a square shape, and insertable features 306 are shown as having a circular shape.

Non-insertable features 304 can include, for example, one or more conductive lands, pads, solder bumps, and/or other compressive features. Insertable features 306 can include one or more pins, bars, posts or LIF features, for example.

In the configuration shown, multiple non-insertable and insertable features 304, 306 are shown. Non-insertable features 304 can be located in proximity to each other in one or more regions (e.g., the center region 310, as illustrated) of the package 302. Similarly, insertable features 306 can be located in proximity to each other in one or more other regions (e.g., the peripheral region, as illustrated) of the package 302.

The specific embodiment of FIG. 3 shows 256 non-insertable features 304 and 144 insertable features 306, bringing the total feature count to 400 features. In alternate embodiments, more or fewer of either type of feature could be used, and the total feature count could be greater or smaller.

FIG. 4 illustrates a bottom view of an electronic circuit package, in accordance with another embodiment of the invention. The bottom surface of the package 402 includes at least one non-insertable feature 404 and at least one insertable feature 406. In the illustrated embodiment, insertable features 406 include at least one "bar" type of feature, which is a feature having a length that is a substantial multiple of the feature's width.

The specific embodiment of FIG. 4 shows 320 non-insertable features 404 and 4 insertable features 406, bringing the total feature count to 324 features. In alternate embodiments, more or fewer of either type of feature could be used, and the total feature count could be greater or smaller.

Besides the configurations illustrated in FIGS. 3 and 4, numerous other configurations fall within the scope of the present inventive subject matter. These other configurations could include different numbers and different types of non-insertable and insertable features, as well as varying the arrangement of the features with respect to each other. In alternate embodiments, the non-insertable and insertable features can be interspersed with each other, or groups of each type of feature can be located in different regions. For example, but not by way of limitation, the features could be arranged in a pattern that alternates between insertable and non-insertable features. Alternatively, the insertable features could be located in the center region, and the non-insertable features could be located in the peripheral region. Numerous other configurations could be designed, as would be obvious to those of skill in the art based on the description herein. In addition, although the embodiments illustrated in FIGS. 3 and 4 show an array of 20 rows and 20 columns of features, more or fewer rows or columns of features could be used in other embodiments.

Figure 5:
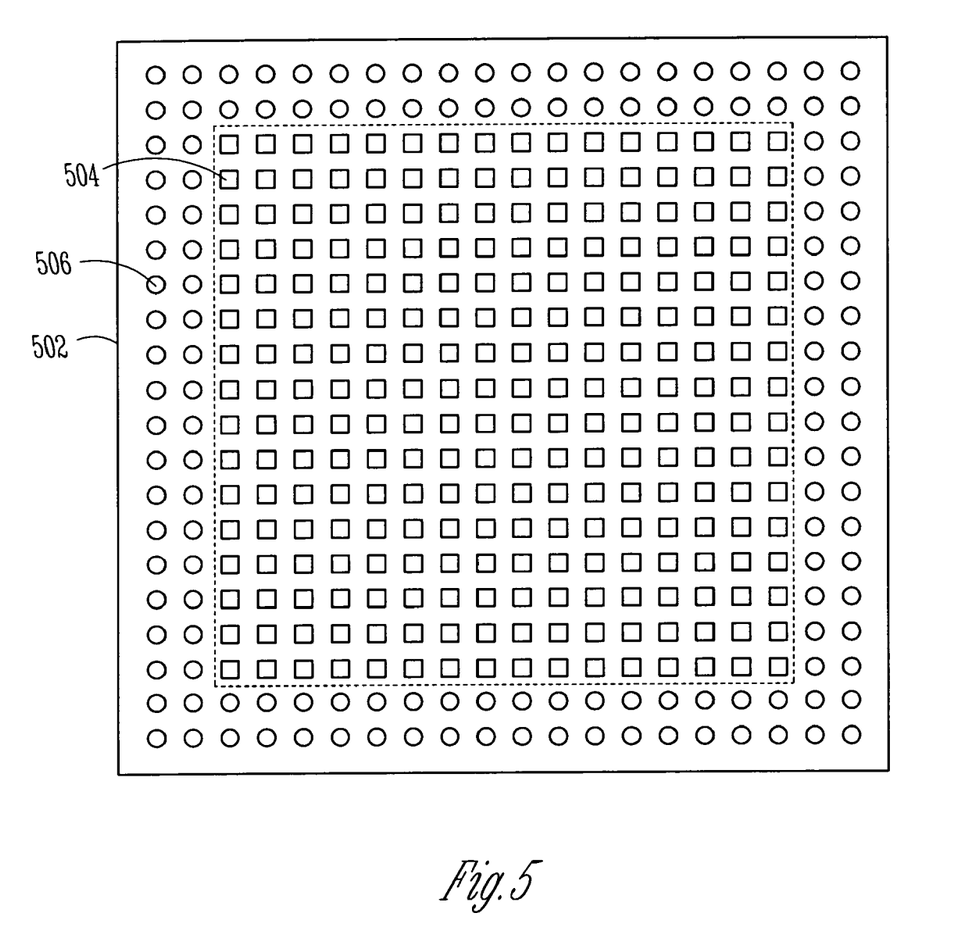
FIG. 5 illustrates a top view of a receptacle, in accordance with an embodiment of the invention.
Figure 6:
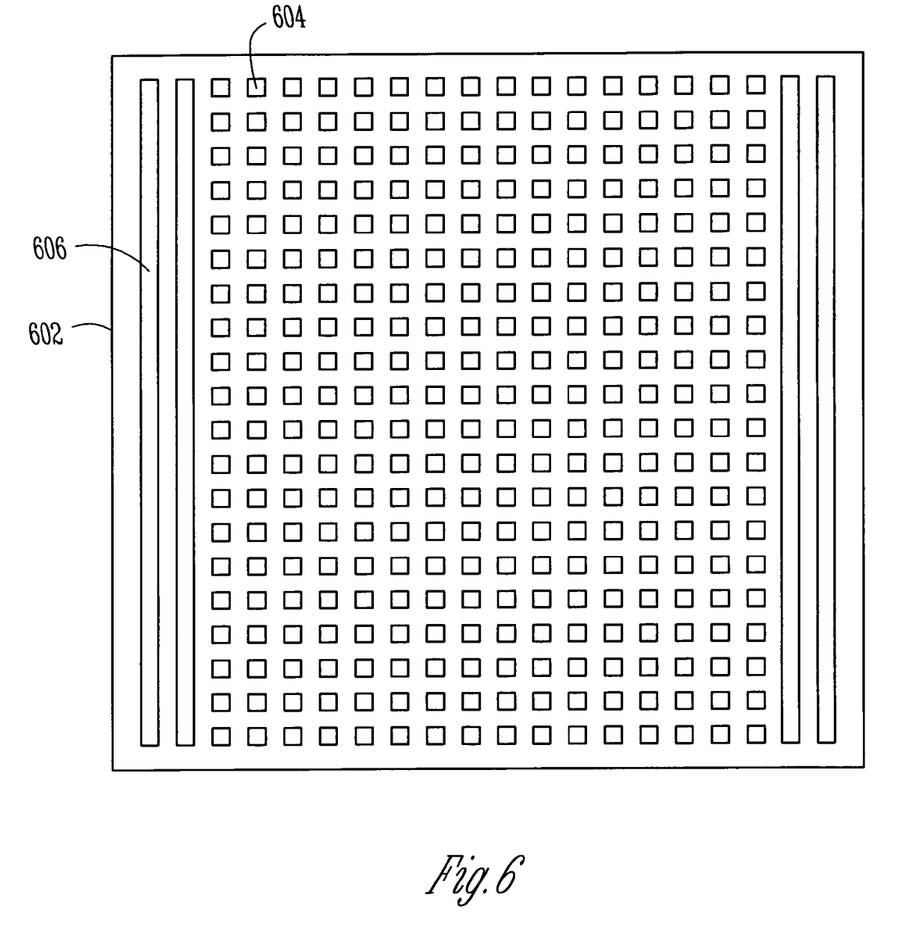
FIG. 6 illustrates a top view of a receptacle, in accordance with another embodiment of the invention.

FIGS. 5 and 6 are used to illustrate the corresponding arrangement of contacts on a hybrid receptacle, which could accommodate the package features illustrated in FIGS. 3 and 4, respectively. As with the previous figures, FIGS. 5 and 6 are used to illustrate just two possible embodiments, and they are not meant to limit the scope of the present inventive subject matter.

FIG. 5 illustrates a top view of a receptacle 502, in accordance with an embodiment of the invention. The receptacle 502 of FIG. 5 could facilitate connection with the package of FIG. 3. Accordingly, the top surface of receptacle 502 includes at least one non-insertable contact 504 and openings 506 to at least one insertable contact. Non-insertable contacts 504 can include, for example, one or more conductive lands, pads, solder bumps, and/or other compressive or other contacts. Insertable contacts can include one or more openings 506 and internal conductive structures to support connection with bars, pins, posts or LIF features, for example.

FIG. 6 illustrates a top view of a receptacle 602, in accordance with another embodiment of the invention. The receptacle 602 of FIG. 6 could facilitate connection with the package of FIG. 4. Accordingly, the top surface of the receptacle 602 includes at least one non-insertable contact 604 and openings 606 to at least one insertable contact. As with the embodiment illustrated in FIG. 5, non-insertable contacts 604 can include, for example, one or more conductive lands, pads, solder bumps, and/or other compressive or other contacts. Insertable contacts can include one or more openings 606 and internal conductive structures to support connection with bars, pins, posts or LIF features, for example.

Besides the configurations illustrated in FIGS. 5 and 6, numerous other configurations fall within the scope of the present inventive subject matter. These other configurations could include different numbers and different types of non-insertable and insertable contacts, as well as varying the arrangement of the contacts with respect to each other. For example, instead of concentrating the non-insertable contacts toward the center of the receptacle and the non-insertable contacts toward the periphery, the opposite configuration could be used, or the non-insertable and insertable contacts could be interspersed or arranged in a different pattern.

Figure 7:
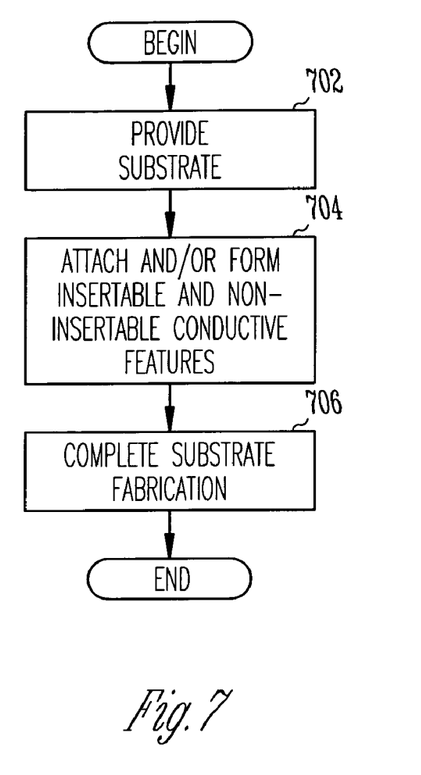
FIG. 7 illustrates a flowchart of a method for fabricating an electronic circuit package having both non-insertable and insertable conductive features, in accordance with an embodiment of the invention.

FIG. 7 illustrates a flowchart of a method for fabricating a substrate having both non-insertable and insertable features, in accordance with an embodiment of the invention. The method could apply, for example, to fabrication of an integrated circuit package, a package for another type of electrical system (e.g., a system of discrete devices), an interposer (i.e., a substrate that provides a dimensional interface between two other levels of interconnect), a socket, or a printed circuit board that interconnects with another level of interconnect.

First, in block 702, a substrate is provided. The substrate could be formed using a variety of fabrication techniques, including techniques for forming single or multi-layer substrates having patterned conductive layers. The substrate could include from one to many layers of conductive materials and one or more layers of insulating materials (e.g., inorganic or organic materials). The substrate could include organic and/or inorganic materials. In one embodiment, the substrate is relatively rigid.

In block 704, insertable and non-insertable features are then attached and/or formed on the substrate. For example, insertable features (e.g., pins, bars, LIF features, or other features) could be bonded, soldered or otherwise adhered to conductive pads on a surface of the substrate. In another embodiment, the insertable features could be embedded within the substrate so that they contact conductive structures within the substrate, and they protrude in a substantially perpendicular direction from a surface of the substrate.

The non-insertable features could be formed as a part of the substrate fabrication process, or they could be formed later. For example, a photolithography process could be performed to expose portions of a conductive layer, where those portions represent pads. In this embodiment, the pads are slightly recessed below the surface of the substrate. In another embodiment, conductive pads are formed directly on the surface of the substrate, in contact with conductive structures within the substrate. The pads serve as the non-insertable features, in one embodiment. In another embodiment, conductive bumps are deposited on the pads to serve as the non-insertable features. In still another embodiment, the non-insertable features could be compression features (e.g., metal or elastomeric features), which may be attached to conductive structures within the substrate.

Once the insertable and non-insertable features are attached or formed, fabrication of the substrate is completed, in block 706. This could include, for example, attaching other features, contacts, and/or one or more integrated circuits, caps, and/or discrete devices to the substrate. The method then ends.

Figure 8:
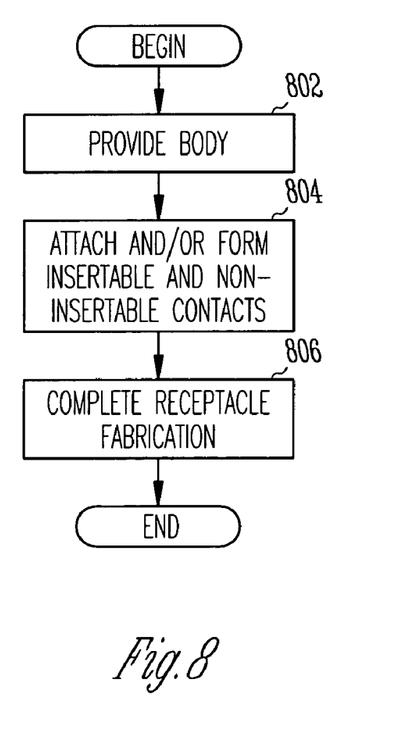
FIG. 8 illustrates a flowchart of a method for fabricating a receptacle having both non-insertable and insertable contacts, in accordance with an embodiment of the invention.

FIG. 8 illustrates a flowchart of a method for fabricating a receptacle having both non-insertable contacts and insertable contacts, in accordance with an embodiment of the invention. The receptacle is fabricated so that it is connectable to a substrate fabricated in accordance with the method described previously in conjunction with FIG. 7. The method could apply, for example, to fabrication of an interposer (i.e., a substrate that provides a dimensional interface between two other levels of interconnect), a socket, a printed circuit board, or some other level of interconnection.

First, in block 802, a body (e.g., body 122, FIG. 1) is provided. The body could be formed using a variety of fabrication techniques, including techniques for forming single or multi-layer bodies, which may or may not include patterned conductive layers. The body could include from one to many layers of conductive materials and one or more layers of insulating materials (e.g., inorganic or organic materials). In one embodiment, the substrate is relatively rigid, although the substrate could be non-rigid in other embodiments.

In block 804, insertable and non-insertable contacts are attached to and/or formed within the body. Formation of the insertable contacts is performed during fabrication of the body, in one embodiment. Insertable contacts are designed to accept insertable features (e.g., pins, bars, LIF features, or other features). In one embodiment, the orientation of the insertable contacts is designed in a complementary manner to the orientation of the insertable features of a corresponding package (or other substrate).

In one embodiment, each insertable contact includes an opening on a surface of the body, and an internal conductive structure designed to physically connect with an insertable feature. The internal conductive structure could automatically hold the insertable feature by spring force (e.g., for a pin contact), or the body could include a mechanism for forcing an inserted feature against portions of the conductive structure (e.g., for a LIF contact). Alternatively, inserted features could be forced against portions of the conductive structure using an external mechanism, as described previously.

Non-insertable contacts are attached to and/or formed on or within the body. The non-insertable contacts are designed to compress against non-insertable features (e.g., lands, pads, solder bumps, or compression features). In one embodiment, the orientation of the non-insertable contacts is designed in a complementary manner to the orientation of the non-insertable features of a corresponding package (or other substrate).

The non-insertable contacts could be formed as a part of the body fabrication process, or they could be formed later. For example, the non-insertable contacts could include conductive structures that protrude from the top surface (e.g., as illustrated in FIG. 1) and contact a corresponding feature on the package.

In another embodiment, a photolithography process could be performed to expose portions of a conductive layer, where those portions represent pads. In this embodiment, the pads are slightly recessed below the surface of the body. In still another embodiment, conductive pads are formed directly on the surface of the body, in contact with conductive structures within the body. The pads serve as the non-insertable contacts, in one embodiment.

In still another embodiment, conductive bumps are deposited on the pads to serve as the non-insertable contacts. In other embodiments, non-insertable contacts could include single or double compression features (e.g., elastomeric features).

Once the insertable and non-insertable contacts are attached or formed, fabrication of the receptacle is completed, in block 806. This could include, for example, attaching other features, contacts, and/or one or more integrated circuits and/or discrete devices to the receptacle. The method then ends.

Figure 9:
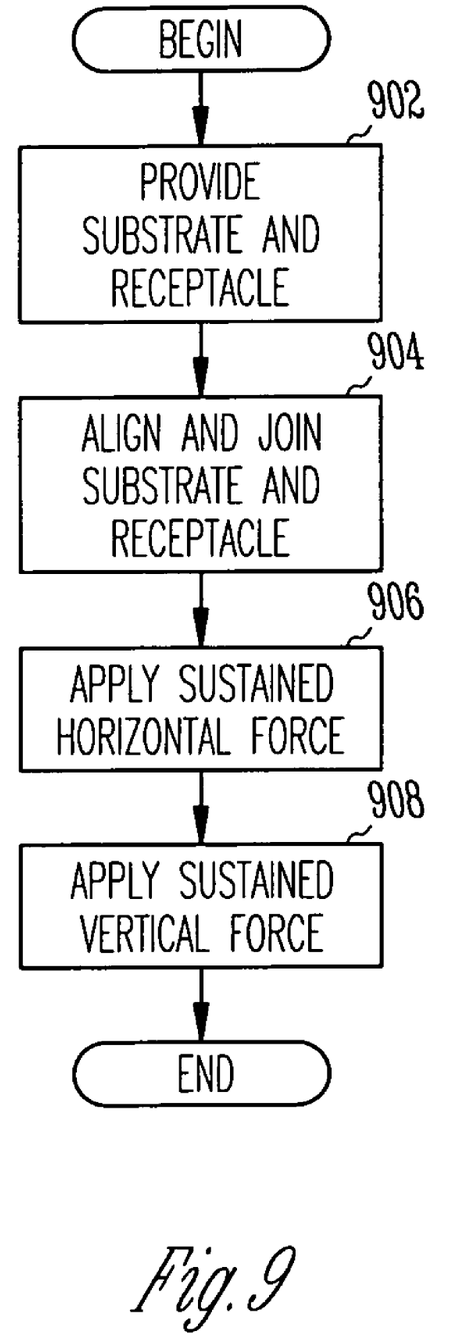
FIG. 9 illustrates a flowchart of a method for assembling an electronic circuit package and a receptacle, in accordance with an embodiment of the invention.

FIG. 9 illustrates a flowchart of a method for assembling a substrate and a receptacle, in accordance with an embodiment of the invention. The method begins, in block 902, by providing the substrate and the receptacle. For example, the substrate could be an integrated circuit package, and the receptacle could be a socket. Other types of substrates and/or receptacles could also benefit from the various embodiments, as discussed elsewhere in this description.

Next, in block 904, the substrate and receptacle are aligned and joined, by inserting the insertable features into the insertable contacts. For example, if the insertable features are pins, a temporary downward force is applied to push the pins into contact with opposing surfaces within the contact. Alternatively, if the insertable features are LIF features, the LIF features are inserted within the LIF contacts with little or no temporary downward force.

In block 906, a sustained, normal force (e.g., a horizontal force) is then applied. In an embodiment that uses pins, the sustained horizontal force is automatically applied by the spring forces associated with the contact surfaces within the pinned contacts. In an embodiment that uses LIF contacts, a horizontal force mechanism is engaged, where the horizontal force mechanism can be internal to the receptacle. Alternatively, an external horizontal force mechanism could be applied to the package.

In block 908, a sustained, vertical, compressive force is then applied to compress the non-insertable features against the non-insertable contacts. For example, a plate could be applied to the top surface of the package, and the plate could be bolted to the PC board in a manner that causes the plate to apply a sustained vertical force sufficient to hold the non-insertable features in compression against the non-insertable contacts across the expected operational range of the device. The method then ends.

In an alternate embodiment, as discussed previously, a diagonal force mechanism could be used to establish horizontal and vertical force components. The diagonal force mechanism could be used in conjunction with or in lieu of the horizontal and/or vertical force mechanisms.

It should be noted that the methods described herein do not have to be executed in the order described, or necessarily in any particular order. Moreover, various activities described with respect to the methods identified herein can be executed in serial or parallel fashion.

Figure 10:
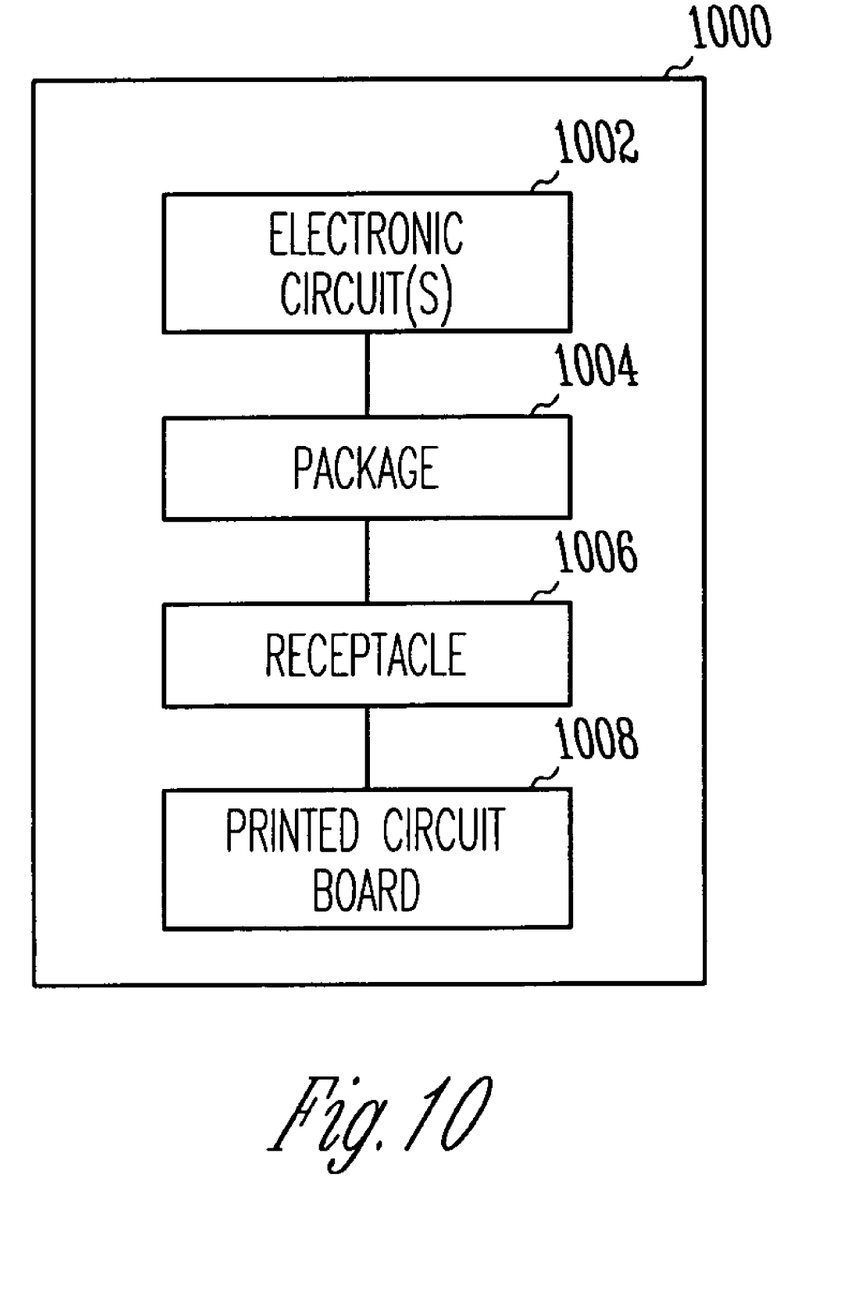
FIG. 10 illustrates an electronic system, in accordance with an embodiment of the invention.

The configurations described above in conjunction with various embodiments could form part of an electronic system. FIG. 10 illustrates an electronic system 1000, in accordance with an embodiment of the present invention. The system 1000 shown in FIG. 10 could be, for example, a server, desktop, portable or handheld computer, a wireless or wired communication device (e.g., telephone, modem, cell phone, pager, radio, etc.), a television, a monitor, or virtually any other type of electronic system that could benefit from the use of the interconnect embodiments described in conjunction with the inventive subject matter.

The electronic system 1000 includes one or more electronic circuits 1002 (e.g., a microprocessor, memory device, other IC, and/or discrete circuits), which are electrically attached to a package 1004, receptacle 1006 (e.g., a socket or other level of interconnect), and PC board 1008. In an alternate embodiment, receptacle 1006 could be integral with PC board 1008.

Depending on the type of electronic system, other components (not illustrated) also could be included. For example, the system 1000 also could include one or more memory devices, busses, power supplies, amplifiers, ASICs, user interfaces (e.g., speaker, microphone, display, keyboard, etc.), network interfaces, optical or radio frequency (RF) interfaces, and/or other component and subsystems.

Various embodiments of a hybrid package and receptacle have been described, along with a description of the incorporation of the embodiments within an electronic system. The foregoing description of specific embodiments reveals the general nature of the inventive subject matter sufficiently that others can, by applying current knowledge, readily modify and/or adapt it for various applications without departing from the generic concept. Therefore such adaptations and modifications are within the meaning and range of equivalents of the disclosed embodiments.

For example, the various feature counts and sustained compressive and normal forces provided in this description are given by way of example only. In alternate embodiments, aspects of the inventive subject matter could be applied in assemblies that have higher or lower absolute or proportional feature counts. In addition, in alternate embodiments, higher or lower vertical compressive and/or normal forces could be used. In still other embodiments, non-insertable features and contacts could be used to carry other than I/O, and insertable features and contacts could be used to provide other than power and ground.

Various embodiments could include, for example, but not by way of limitation: a) hybrid packages and receptacles having feature counts of less than 100 features; b) hybrid packages and receptacles having feature counts of 100 or more features; c) hybrid packages and receptacles having feature counts of 400 or more features; d) hybrid packages and receptacles having feature counts of 600 or more features; e) hybrid packages and receptacles having feature counts of 800 or more features; f) hybrid packages and receptacles having feature counts of 1000 or more features; g) hybrid packages and receptacles having a first number of non-insertable features or contacts in a range of 50-99% of the total number of features or contacts, and a second number of insertable features or contacts in a range of 1-50% of the total number of features or contacts; or h) hybrid packages and receptacles having a first number of non-insertable features or contacts in a range of 1-50% of the total number of features or contacts, and a second number of insertable features or contacts in a range of 50-99% of the total number of features or contacts.

The Figures illustrate embodiments where the bottom surface of one level of interconnect (e.g., a package) includes only features, while the top surface of the next level of interconnect (e.g., a socket) includes only contacts. In still other embodiments, either or both the non-insertable or insertable features and contacts could be located on the opposed level of interconnect. In other words, the bottom surface of one level of interconnect could include features and contacts, and the top surface of the next level of interconnect could include corresponding contacts and features. Alternatively, the bottom surface of one level of interconnect could include the contacts, while the top surface of the next level of interconnect could include the features.

FIGS. 1 through 6 are merely representational and are not drawn to scale. Certain proportions thereof may be exaggerated, while others may be minimized. FIGS. 1-10 are intended to illustrate various implementations of the subject matter that can be understood and appropriately carried out by those of ordinary skill in the art.

While certain structures or operations have been described herein relative to the reader's perspective, such as "top" or "bottom", "upper" or "lower", "left" or "right", "front" or "rear", and so forth, it will be understood that these descriptors are relative, and that they would be reversed if the particular structure being described (e.g. an integrated circuit, substrate or package) were inverted, rotated, or viewed in mirror-image. Therefore, these terms are not intended to be limiting.

It is emphasized that the Abstract is provided to comply with 37 C.F.R. §1.72(b), which requires an Abstract that will allow a reader to quickly ascertain the nature and gist of the technical disclosure. The Abstract is submitted with the understanding that it will not be used to interpret or limit the scope or meaning of the claims.

In the foregoing Detailed Description, various features are grouped together in various embodiments for the purpose of streamlining the disclosure. This method of disclosure is not to be interpreted as reflecting an intention that the claimed embodiments of the inventive subject matter require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate preferred embodiment.

The phraseology or terminology employed herein is for the purpose of description and not of limitation. Accordingly, it is to be understood that the appended claims are intended to cover all such alternatives, modifications, equivalents and variations as fall within the spirit of the inventive subject matter.

What is claimed is:

1. A method comprising:
   forming one or more non-insertable features at a first surface of an electronic circuit package; and
   attaching at least one conductive, low insertion force, insertable feature extending perpendicularly from the first surface in a vertical direction, wherein the at least one conductive, low insertion force, insertable feature contacts conductive structures within the electronic circuit package, and wherein the at least one conductive, low insertion force, insertable feature is configured to receive a horizontal force, provided by a horizontal force mechanism, to engage the at least one conductive, low insertion force, insertable feature with a receptacle.

2. The method of claim 1, wherein forming the one or more non-insertable features comprises forming one or more lands.

3. The method of claim 1, wherein attaching the one or more insertable features comprises attaching one or more low insertion force contacts.

4. The method of claim 1 wherein, in forming, the electronic circuit package comprises an integrated circuit package.

5. The method of claim 1 wherein, in attaching, the receptacle comprises a socket.

6. The method of claim 1 wherein, in attaching, the receptacle comprises an interposer.

7. A method for fabricating a receptacle for accepting a single electronic circuit package, the method comprising:
   forming a body;
   forming at least one non-insertable, land grid array contact having contact portions exposed at a first surface of the body of the receptacle;
   forming at least one insertable contact having an opening on the first surface and conductive structures within the body of the receptacle, wherein the at least one non-insertable contact and the at least one insertable contact are arranged to make electrical contact with non-insertable features and insertable features of a single electronic circuit package brought into contact with the receptacle; and
   forming electrical interfaces on a second surface of the body of the receptacle, wherein the electrical interfaces are electrically connected to the at least one non-insertable, land grid array contact and the at least one insertable contact.

8. The method of claim 7 wherein the receptacle comprises a socket.

9. The method of claim 7 wherein the receptacle comprises an interposer.

10. A method comprising:
    aligning an electronic circuit package with a receptacle, wherein the electronic circuit package comprises at least one non-insertable feature at a first package surface, and at least one insertable feature extending perpendicularly from the first package surface, wherein the at least one insertable feature is configured to receive a horizontal force, provided by a horizontal force mechanism, and wherein the receptacle comprises at least one non-insertable contact at a first receptacle surface, and at least one insertable contact having an opening on the first receptacle surface;
    joining the electronic circuit package and the receptacle by inserting the at least one insertable feature into the at least one insertable contact; and applying the horizontal force to the at least one insertable feature to secure the electronic circuit package to the receptacle.

11. The method of claim 10, further comprising applying a sustained, vertical, compressive force to compress the at least one non-insertable feature toward the at least one non-insertable contact.

12. The method of claim 10, further comprising applying the horizontal force to compress the at least one insertable feature toward a conductive surface within the at least one insertable contact.

13. The method of claim 10 wherein, in applying the horizontal force, the horizontal force mechanism comprises a low insertion force mechanism.

14. A method comprising:
  interchanging input/output signals between first electronic circuits, which use or produce the input/output signals, and one or more non-insertable features at a first surface of an electronic circuit package; and
  interchanging power between second electronic circuits, which consume the power, and one or more insertable features at the first surface, wherein the one or more insertable features are configured to receive a horizontal force, provided by a horizontal force mechanism, to engage the one or more insertable features with a corresponding one or more sockets of a receptacle, and wherein the electronic circuit package houses the first electronic circuits and the second electronic circuits.

15. The method of claim 14, wherein interchanging the input/output signals comprises interchanging the input/output signals between the first electronic circuits and one or more land grid array lands.

16. The method of claim 14, wherein interchanging the power comprises interchanging the power between the second electronic circuits and one or more low insertion force features.

* * * * *